US012597958B2

(12) United States Patent (10) Patent No.: US 12,597,958 B2
Jess (45) Date of Patent: Apr. 7, 2026

---

(54) RF FRONT-END ARCHITECTURE

(71) Applicant: Skyworks Solutions, Inc., Irvine, CA (US)

(72) Inventor: Nathan George Jess, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 303 days.

(21) Appl. No.: 18/370,350

(22) Filed: Sep. 19, 2023

(65) Prior Publication Data

US 2024/0097733 A1 Mar. 21, 2024

Related U.S. Application Data

(60) Provisional application No. 63/408,221, filed on Sep. 20, 2022.

(51) Int. Cl.
*H04B 1/40* (2015.01)
*H03F 3/24* (2006.01)

(52) U.S. Cl.
CPC .............. *H04B 1/40* (2013.01); *H03F 3/245* (2013.01); *H03F 2200/451* (2013.01)

(58) Field of Classification Search
CPC ........ H04B 1/40; H04B 1/005; H04B 7/0413; H04B 1/0092; H04B 5/48; H03F 3/245; H03F 2200/451; H03F 3/189; H03F 3/24
See application file for complete search history.

(56) References Cited

U.S. PATENT DOCUMENTS

| | | | | |
|---|---|---|---|---|
| 5,857,003 | A | * | 1/1999 | Geiger ................ H04L 27/2272 |
| | | | | 455/307 |
| 8,467,738 | B2 | | 6/2013 | Gorbachov |
| 9,621,327 | B2 | | 4/2017 | Chang et al. |
| 9,755,670 | B2 | | 9/2017 | Chen et al. |
| 10,069,615 | B2 | | 9/2018 | Chang et al. |
| 10,111,115 | B2 | | 10/2018 | Lam et al. |
| 10,211,861 | B2 | | 2/2019 | Vaillancourt et al. |
| 10,276,521 | B2 | | 4/2019 | Babcock et al. |
| 10,333,474 | B2 | | 6/2019 | Alon et al. |
| 10,477,550 | B2 | | 11/2019 | Balteanu |
| 10,727,893 | B2 | | 7/2020 | Zhang et al. |

(Continued)

OTHER PUBLICATIONS

Data Sheet "SKY85747-11:5 GHz High-Power WLAN Front-End Module," Skyworks Solutions, Inc., Dec. 19, 2019, in 13 pages.

*Primary Examiner* — Andrew Wendell
(74) *Attorney, Agent, or Firm* — Knobbe, Martens, Olson & Bear, LLP

(57) ABSTRACT
A front-end system includes a first terminal that receives a radio frequency signal from a transceiver and a second terminal coupled to an antenna. A front-end module including a power amplifier amplifies the radio frequency signal when powered by a supply signal. The front-end module includes a reference signal generator that generates a reference signal and modulates the reference signal frequency based on the supply signal. The frequency-modulated reference signal is transmitted to the transceiver through the first terminal. The front-end module can also include a voltage sensor that senses a voltage level at the first terminal when the frequency-modulated reference signal is being transmitted to the transceiver to determine at least one control signal for controlling the front-end module.

20 Claims, 11 Drawing Sheets

(56) References Cited

U.S. PATENT DOCUMENTS

| | | | |
|---|---|---|---|
| 10,841,138 B2 * | 11/2020 | Farzan | H04L 25/0282 |
| 10,924,160 B2 | 2/2021 | Wloczysiak | |
| 11,018,714 B2 | 5/2021 | Arfaei Malekzadeh et al. | |
| 11,064,491 B2 | 7/2021 | Balteanu | |
| 11,283,481 B2 * | 3/2022 | Iwai | H04B 1/7073 |
| 11,374,610 B2 | 6/2022 | Arfaei Malekzadeh et al. | |
| 11,496,101 B2 | 11/2022 | Alon et al. | |
| 11,664,829 B2 | 5/2023 | Jayaraman et al. | |
| 2014/0235184 A1 * | 8/2014 | Ichitsubo | H04B 1/0067 |
| | | | 455/101 |
| 2014/0235187 A1 * | 8/2014 | Vidojkovic | H03F 3/24 |
| | | | 455/127.3 |
| 2016/0079046 A1 * | 3/2016 | Kim | H01J 49/022 |
| | | | 250/288 |
| 2016/0079934 A1 * | 3/2016 | Ichitsubo | H04B 1/006 |
| | | | 330/251 |
| 2018/0254852 A1 * | 9/2018 | Avivi | H04L 1/0033 |
| 2020/0264272 A1 * | 8/2020 | Visweswaran | H01Q 1/525 |
| 2021/0333906 A1 * | 10/2021 | Noh | G06F 21/32 |
| 2022/0190931 A1 * | 6/2022 | Strobel | H04B 10/69 |
| 2024/0146260 A1 * | 5/2024 | Li | H03F 3/72 |

* cited by examiner

RF

GHz

Frequency $V_{DET}$ = Freq. modulation
CTL = Voltage level

MHz

RF FRONT-END ARCHITECTURE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to front-end modules (FEM) for use in radio frequency (RF) electronics.

Description of the Related Technology

Radio frequency (RF) is a common term for a range of frequency of electromagnetic radiation typically used to produce and detect radio waves. Such a range can be from about 30 kHz to 300 GHz. Wireless communication devices often include front-end circuitry for processing or conditioning RF signals at an incoming or outgoing frequency or signal port. RF front-end modules may be components of receiver, transmitter, or transceiver systems associated with a wireless device.

RF front-end design may include a number of considerations, including complexity, substrate compatibility, performance, and integration. It can be desirable for wireless devices to support multiple wireless technologies. For instance, modern mobile phones and other wireless devices send and receive growing quantities of electronic data including email, electronic documents, data communicated during web browsing sessions, and the like, often by incorporating a wide area network (WLAN) interface. Modern devices often also support wireless connection to other electronic devices that are local to the user, including wireless headsets, ear pieces, watches, and other so called "wearable" devices. For instance, some wireless devices support Bluetooth communication, and can connect to Bluetooth capable wearable devices, or other Blue-tooth capable devices in proximity to the wireless device.

SUMMARY

In some aspects, the techniques described herein relate to a front-end system including: a first terminal configured to receive a radio frequency signal from a transceiver; a second terminal configured to be coupled to an antenna; and a front-end module including a power amplifier configured to amplify the radio frequency signal when powered by a supply signal, the front-end module including a reference signal generator configured to generate a reference signal which is apart in frequency from the radio frequency signal, the reference signal generator configured to modulate a frequency of the reference signal based on the supply signal, the frequency-modulated reference signal being transmitted to the transceiver through the first terminal, the front-end module including a voltage sensor configured to sense a voltage level at the first terminal when the frequency-modulated reference signal is being transmitted to the transceiver to determine at least one control signal for controlling the front-end module.

2

In some aspects, the techniques described herein relate to a front-end system wherein the first terminal is configured to be coupled to a single transmission line connecting the front-end module with the transceiver.

In some aspects, the techniques described herein relate to a front-end system wherein the single transmission line is at least one of a coaxial cable, a microstrip line, a strip line, and a conductor transmission line.

In some aspects, the techniques described herein relate to a front-end system further including a controller configured to control a state of the front-end module based on the determined control signal.

In some aspects, the techniques described herein relate to a front-end system wherein the controller is configured to control at least one of an operation of the power amplifier, a receive amplifier or a switch included in the front-end module, and an envelope tracking signal.

In some aspects, the techniques described herein relate to a front-end system wherein the controller is configured to control a voltage controlled oscillator (VCO) included in the reference signal generator to perform the frequency modulation on the reference signal.

In some aspects, the techniques described herein relate to a front-end system wherein the supply signal has a form of an analog signal corresponding to the frequency-modulated reference signal.

In some aspects, the techniques described herein relate to a front-end system wherein the voltage level sensed at the first terminal corresponds to one of a plurality of values, each of which represents a respective control signal.

In some aspects, the techniques described herein relate to a transceiver including: a terminal coupled to a front-end system configured to transmit a radio frequency signal to the front-end system and to receive a frequency-modulated reference signal from the front-end system, the frequency-modulated reference signal being spaced apart in the frequency domain from the radio frequency signal; a mux/de-mux module configured to determine a supply signal representing an output power of the radio frequency signal at the front-end system based on a frequency of the frequency-modulated reference signal, the mux/de-mux module configured to adjust a termination impedance based on at least one control signal for controlling the front-end module to control a voltage level at the terminal in response to an amplitude of the frequency-modulated reference signal; and a transceiver configured to generate the radio frequency and the at least one control signal, and to process the determined supply signal.

In some aspects, the techniques described herein relate to a transceiver wherein the first terminal is configured to be coupled to a single transmission line connecting the front-end system with the transceiver.

In some aspects, the techniques described herein relate to a transceiver wherein the single transmission line is at least one of a coaxial cable, a microstrip line, a strip line, and a conductor transmission line.

In some aspects, the techniques described herein relate to a transceiver wherein the mux/de-mux module includes a phase-locked loop (PLL) to lock a frequency of the frequency-modulated reference signal to decode the frequency-modulated reference signal, and the mux/de-mux module is configured to transmit the decoded reference signal to the transceiver.

In some aspects, the techniques described herein relate to a transceiver wherein the mux/de-mux module is configured to adjust the termination impedance to control the voltage level to be one of a plurality of values each of which represents a respective control signal.

In some aspects, the techniques described herein relate to a transceiver wherein the transceiver is configured to generate the at least one control signal to control a state of the front-end module.

In some aspects, the techniques described herein relate to a transceiver wherein the control signal is configured to control at least one of an operation of a power amplifier, a receive amplifier or a switch included in the front-end module, and an envelope tracking signal.

In some aspects, the techniques described herein relate to a transceiver wherein the supply signal has the form of an analog signal corresponding to the frequency of the frequency-modulated reference signal.

In some aspects, the techniques described herein relate to a mobile device including: a front-end system configured to amplify a radio frequency signal when powered by a supply signal, the front-end system configured to generate a reference signal which is apart in frequency from the radio frequency signal, the front-end system configured to modulate a frequency of the reference signal based on the supply signal, the front-end system configured to sense a voltage level on a single transmission line when the frequency-modulated reference signal is applied to the single transmission line to determine at least one control signal for controlling the front-end system; the transceiver configured to generate the radio frequency signal and the at least one control signal, the transceiver configured to determine the supply signal based on a frequency of the frequency-modulated reference signal, the transceiver configured to adjust a termination impedance based on the at least one control signal to control the voltage level on the single transmission line in response to an amplitude of the frequency-modulated reference signal, the single transmission line being coupled between the transceiver and the front-end system.

In some aspects, the techniques described herein relate to a mobile device wherein the single transmission line is at least one of a coaxial cable, a microstrip line, a strip line, and a conductor transmission line.

In some aspects, the techniques described herein relate to a mobile device wherein each of the front-end system and the transceiver includes a triplexer configured to combine or extract a DC signal, the frequency-modulated reference signal and the radio frequency signal onto the single transmission line.

In some aspects, the techniques described herein relate to a mobile device wherein the control signal is configured to control a state of the front-end system.

In some aspects, the techniques described herein relate to a mobile device wherein the control signal is configured to control at least one of an operation of a power amplifier, a receive amplifier or a switch included in the front-end system, and an envelope tracking signal.

In some aspects, the techniques described herein relate to a mobile device wherein the supply signal has the form of an analog signal corresponding to the frequency-modulated reference signal.

In some aspects, the techniques described herein relate to a mobile device wherein the voltage level sensed at the first terminal corresponds to one of a plurality of values, each of which represents a respective control signal.

BRIEF DESCRIPTION OF THE DRAWINGS

FIG. 4C shows signal content that can be present on a transmission line between a front-end module and a transceiver according to certain embodiments.

DETAILED DESCRIPTION OF EMBODIMENTS

Figure 1:
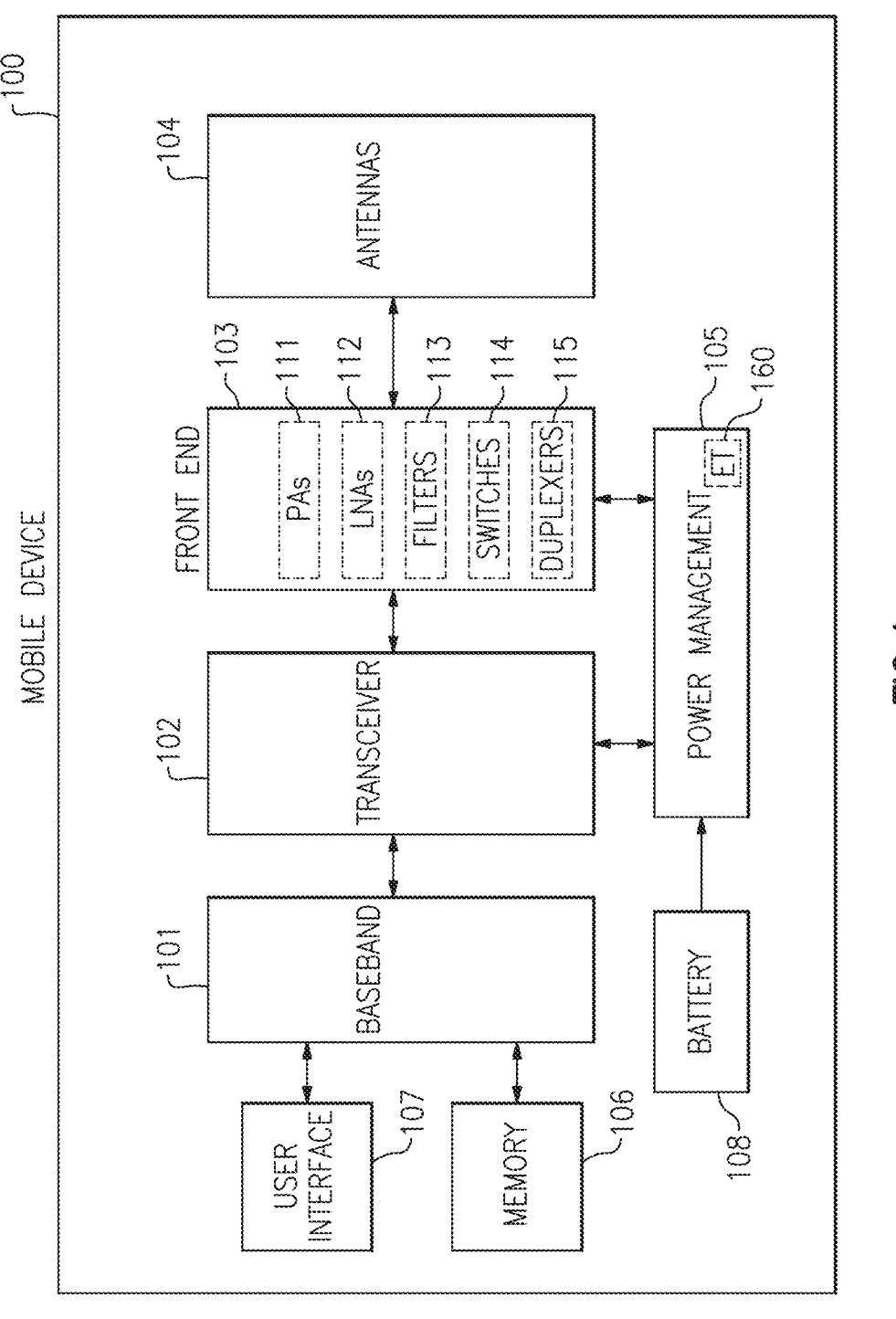
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 101, a transceiver 102, a front-end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front-end system 103 aids in conditioning signals transmitted to and/or received from the antennas 104. In the illustrated embodiment, the front-end system 103 includes power amplifiers (PAs) 111, low noise amplifiers (LNAs) 112, filters 113, switches 114, and duplexers 115. However, other implementations are possible. For example, the power amplifiers 111 can operate as transmit amplifiers for amplifying signals for transmission via the antenna 104, and the low noise amplifiers 112 can operate as receive amplifiers for amplifying signals received by the antennas 104.

For example, the front-end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas associated transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front-end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 1002. As shown in FIG. 1, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

Figure 3:
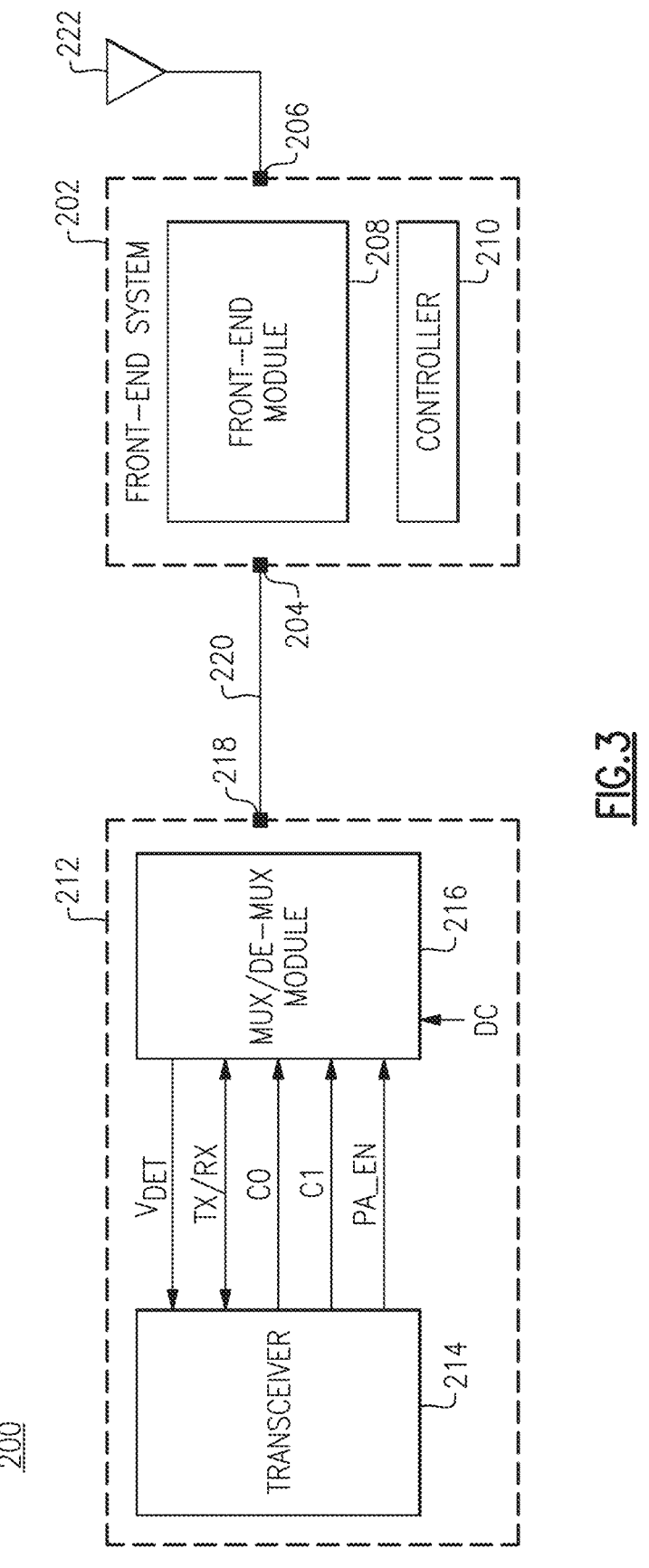
FIG. 3 is an example of schematic diagram of wireless communication architecture including a front-end module according to the present disclosure.

The power management system 105 provides a number of power management functions of the mobile device 100. The power management system 105 of FIG. 3 includes an envelope tracker 160. As shown in FIG. 3, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2:
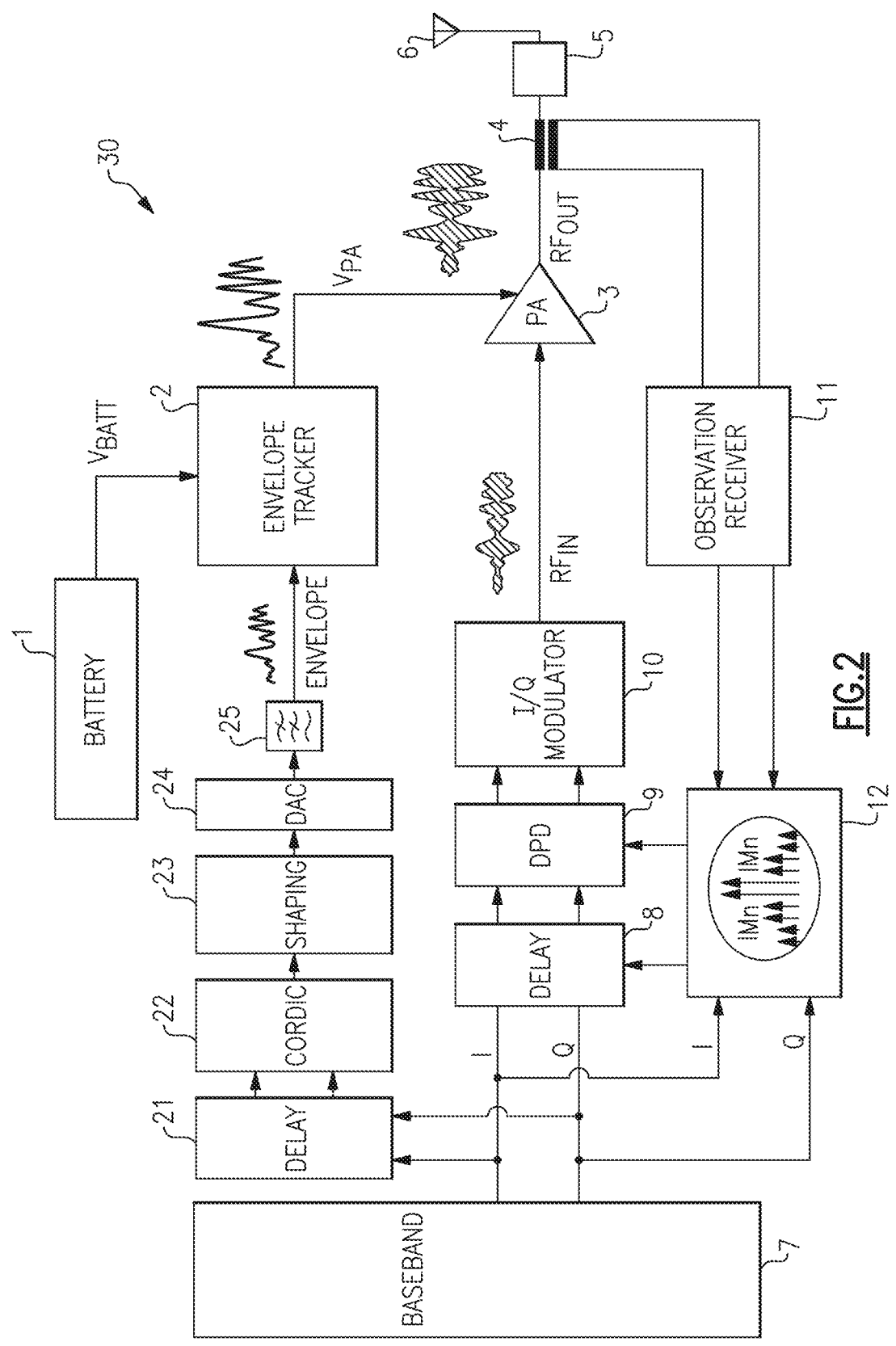
FIG. 2 is a schematic diagram of one embodiment of a transmit system for transmitting radio frequency (RF) signals from a mobile device.

FIG. 2 is a schematic diagram of one embodiment of a transmit system for transmitting RF signals from a mobile device. The transmit system 30 includes a battery 1, an envelope tracker 2, a power amplifier 3, a directional coupler 4, a duplexing and switching circuit 5, an antenna 6, a baseband processor 7, a signal delay circuit 8, a digital pre-distortion (DPD) circuit 9, an I/Q modulator 10, an observation receiver 11, an intermodulation detection circuit 12, an envelope delay circuit 21, a coordinate rotation digital computation (CORDIC) circuit 22, a shaping circuit 23, a digital-to-analog converter 24, and a reconstruction filter 25.

The transmit system 30 of FIG. 2 illustrates one example of an RF communication system that can include power amplifier(s) implemented in accordance with one or more features of the present disclosure. However, the teachings herein are applicable to RF communication systems implemented in a wide variety of ways.

The baseband processor 7 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 10 in a digital format. The baseband processor 7 can be any suitable processor configured to process a baseband signal. For instance, the baseband processor 7 can include a digital signal processor, a microprocessor, a programmable core, or any combination thereof.

The signal delay circuit 8 provides adjustable delay to the I and Q signals to aid in controlling relative alignment between the envelope signal and the RF signal $RF_{IN}$. The amount of delay provided by the signal delay circuit 8 is controlled based on amount of intermodulation detected by the intermodulation detection circuit 12.

The DPD circuit 9 operates to provide digital shaping to the delayed I and Q signals from the signal delay circuit 8 to generate digitally pre-distorted I and Q signals. In the illustrated embodiment, the DPD provided by the DPD circuit 9 is controlled based on amount of intermodulation detected by the intermodulation detection circuit 12. The DPD circuit 9 serves to reduce a distortion of the power amplifier 3 and/or to increase the efficiency of the power amplifier 3. The DPD circuit 9 is configured to provide the power amplifier 3 with bias signal, which is controlled by a loop through the baseband processor 7. Therefore, the power amplifier 3 is powered by a supply voltage and biased by a bias signal.

The I/Q modulator 10 receives the digitally pre-distorted I and Q signals, which are processed to generate an RF signal $RF_{IN}$. For example, the I/Q modulator 10 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 3. In certain implementations, the I/Q modulator 10 can include one or more filters configured to filter frequency content of signals processed therein.

The envelope delay circuit 21 delays the I and Q signals from the baseband processor 7. Additionally, the CORDIC circuit 22 processes the delayed I and Q signals to generate a digital envelope signal representing an envelope of the RF signal $RF_{IN}$. Although FIG. 2 illustrates an implementation using the CORDIC circuit 22, an envelope signal can be obtained in other ways.

The shaping circuit 23 operates to shape the digital envelope signal to enhance the performance of the transmit system 30. In certain implementations, the shaping circuit 23 includes a shaping table that maps each level of the digital envelope signal to a corresponding shaped envelope signal level. Envelope shaping can aid in controlling linearity, distortion, and/or efficiency of the power amplifier 3.

In the illustrated embodiment, the shaped envelope signal is a digital signal that is converted by the DAC 24 to an analog envelope signal. Additionally, the analog envelope signal is filtered by the reconstruction filter 25 to generate an envelope signal suitable for use by the envelope tracker 2. In certain implementations, the reconstruction filter 25 includes a low pass filter.

With continuing reference to FIG. 2, the envelope tracker 2 receives the envelope signal from the reconstruction filter 25 and a battery voltage $V_{BATT}$ from the battery 1, and uses the envelope signal to generate a power amplifier supply voltage $V_{PA}$ for the power amplifier 3 that changes in relation to the envelope of the RF signal $RF_{IN}$. The power amplifier 3 receives the RF signal $RF_{IN}$ from the I/Q modulator 10, and provides an amplified RF signal $RF_{OUT}$ to the antenna 6 through the duplexing and switching circuit 5, in this example.

The directional coupler 4 is positioned between the output of the power amplifier 3 and the input of the duplexing and switching circuit 5, thereby allowing a measurement of output power of the power amplifier 3 that does not include insertion loss of the duplexing and switching circuit 5. The sensed output signal from the directional coupler 4 is provided to the observation receiver 11, which can include mixers for down converting I and Q signal components of the sensed output signal, and DACs for generating I and Q observation signals from the downconverted signals.

The intermodulation detection circuit 12 determines an intermodulation product between the I and Q observation signals and the I and Q signals from the baseband processor 7. Additionally, the intermodulation detection circuit 12 controls the DPD provided by the DPD circuit 9 and/or a delay of the signal delay circuit 8 to control relative alignment between the envelope signal and the RF signal $RF_{IN}$.

By including a feedback path from the output of the power amplifier 3 and baseband, the I and Q signals can be dynamically adjusted to optimize the operation of the transmit system 30. For example, configuring the transmit system 30 in this manner can aid in providing power control, compensating for transmitter impairments, and/or in performing DPD.

Although illustrated as a single stage, the power amplifier 3 can include one or more stages. Furthermore, RF communication systems such as mobile devices can include multiple power amplifiers. In such implementations, separate envelope trackers can be provided for different power amplifiers and/or one or more shared envelope trackers can be used.

According to some conventional implementations, front-end modules (FEM) require numerous connections to the transceiver and one connection to the antenna. Due to the signals that need to be passed back and forth between the FEM and the transceiver (baseband) the two components are co-located, for example inside a router. However, routing RF signals through a certain amount of length of a coax cable from the FEM to an antenna causes losses in the cable. This may degrade system sensitivity and requires the PA to generate more RF power to compensate for what is wasted in the RF coax cable connecting the FEM with the antenna. There are both thermal and RF performance benefits locating the FEM at the antenna. From an RF perspective, a significant amount of cable loss can be eliminated. This increases system sensitivity and reduces the required output power of the PA.

On the other hand, modern communications devices will have many FEMs close to the transceiver and all the devices produce a significant amount of heat that needs to be dissipated. Spreading this heat generation out reduces the need for costly heat sinks. In addition, if the FEM can be kept cooler it will have better RF characteristics. In many cases it is not practical to route all the signals required out to the antenna or out to an FEM co-located with an antenna, relatively far from the transceiver, and thus it is advantageous to only require a single input to the FEM.

FIG. 3 is an example of schematic diagram of wireless communication architecture 200 including a front-end module 208 according to an embodiment of the present disclosure.

The wireless communication architecture 200 according to an embodiment of the present disclosure may be a part of mobile device 100 of FIG. 1. As shown in FIG. 3, the wireless communication architecture 200 includes a front-end system 202, a transceiver system 212, and a single transmission line 220 coupled between the front-end system 202 and the transceiver system 212.

The front-end system 202 includes a first terminal 204 configured to receive a radio frequency signal from a transceiver system 212. More specifically, the radio frequency signal may be generated by a transceiver 214 included in the transceiver system 212. The radio frequency signal may have frequency around, for example, 5 GHz or 6 GHz. The radio frequency signal generated by the transceiver 214 may be transmitted to the front-end system 202 through the first terminal 204. The first terminal 204 may be configured to be suitable for being coupled to a single transmission line 220 connecting the front-end-system 202 and the transceiver system 212. The single transmission line 220 may be at least one of a coaxial cable, a micro-strip line, a strip line, and a conductor transmission line. The coaxial cable may have a capacity of delivering multiple signals without interference. The conductor transmission line may be a set of transmission lines including more than 2 signal paths with a capability of transmitting signals from DC to higher than 10 GHz.

The front-end system 202 includes a second terminal 206 suitable for being coupled to an antenna 222. According to an embodiment of the present disclosure, the front-end system 204 may be implemented close to the antenna 222, because the output power form the front-end system 202 can be reduced and therefore the RF characteristic of the architecture 200 can be improved. The close arrangement of the front-end system 202 and the antenna 222 eliminates cable loss coupled between the front-end system 202 and the antenna 222.

The front-end system 202 includes a front-end module 208 configured to amplify the radio frequency signal when powered by a supply signal. The supply signal may be received via a third terminal (not shown) to the front-end module 208. In this disclosure, the supply signal may also be referred to as a detection voltage (Vdet). The front-end module 208 may include a transistor to amplify the radio frequency signal using an applied supply signal. Therefore, the supply signal may directly or indirectly represent an output power of the radio frequency signal at the front-end system 202. Apart from the functions will be explained below, the front-end module 208 may be implemented as described with reference to the front-end illustrated in FIG. 1.

The front-end module 208 may be configured to generate a reference signal which is apart in frequency from the radio frequency signal. Particularly, the reference signal generator may be generated by a reference signal generator included the front-end module 208. According to an embodiment, the reference signal may not be overlapped with the RF signal in frequency domain. For example, the reference signal may have a frequency in the range of 10 MHz, whereas the radio frequency may have a frequency in the range of 5 GHz or 6 GHz.

The front-end module 208 may modulate a frequency of the reference signal based on the supply signal. Particularly, the frequency modulation may be executed by the reference signal generator. According to an embodiment, depending on the amount of supply signal, the frequency modulation of the reference signal can be done differently. In turn, the receiving side of the frequency modulated reference signal may determine the supply signal by decoding the frequency-modulated reference signal. Therefore, the frequency of the frequency-modulated reference signal may represent the supply signal.

According to an embodiment, the reference signal generator may include a voltage controlled oscillator (VCO) for frequency modulation of the reference signal. The VCO may operate based on the supply signal, and it allows the supply signal to be kept in the analog domain.

The frequency-modulated reference signal may be transmitted to the transceiver system 212 via the first terminal 204 and the signal transmission line 220.

The front-end module 208 may be configured to sense a voltage level at the first terminal 204 when the frequency-modulated reference signal is being transmitted to the transceiver system 212. More particularly, the voltage sensing may be executed by a voltage sensor included in the front-end module 208. The front-end module 208 may be configured to determine at least one control signal based on the voltage level sensed at the first terminal 204. The control signal may be generated by the transceiver 214 and can be used to control the front-end module 208. According to an embodiment, the voltage level may correspond to one of a plurality of values (for example, 0, 1, 2, or 3), each of which represents a respective control signal. Therefore, the amplitude of the frequency-modulated reference signal may represent the control signal.

According to an embodiment, the front-end module 202 may further include a controller 210. The controller 210 may be configured to control a state of the front-end module 208. More specifically, the controller 210 may be configured to control at least one of an operation of a power amplifier, a low-noise amplifier or a switch included in the front-end module 208, based on the control signal. Furthermore, the controller 210 may be further configured to control an envelope tracking signal for the front-end module 208.

The transceiver system 212 includes a terminal 218, a transceiver 214 and the mux/de-mux module 216.

The terminal 218 may be coupled to the front-end system 202 to transmit the radio frequency signal to the front-end system 202 and to receive the frequency-modulated reference signal from the front-end system 202. The terminal 218 may be configured to be suitable for being coupled to a single transmission line connecting the front-end system 202 and the transceiver system 212.

The transceiver 214 may be configured to generate the radio frequency signal. According to an embodiment, the transceiver 214 may transmit the radio frequency signal, referred to as Tx/Rx in FIG. 3, to the mux/de-mux module 216. The transceiver 214 may be also configured to generate the at least one control signal. According to an embodiment, the transceiver 214 may transmit the at least one control signal, referred to as C0, C1, PA_EN in FIG. 3, to the mux/de-mux module 216.

Furthermore, the transceiver 214 may be configured to process the determined supply signal. The supply signal may be used to adjust the envelope signal or to control the state of the front-end module 208. For that, the supply signal, referred to as Vdet in FIG. 3, may be transmitted from the mux/de-mux module 216 to the transceiver 214.

The transceiver 214 may be implemented to include functions that are described with reference to transceiver 102 of FIG. 1.

The mux/de-mux module 216 may be configured to determine the supply signal that represents an output power of the radio frequency signal at the front-end system 202, based on a frequency-modulated reference signal. The mux/de-mux module 216 may be configured to decode the frequency-modulated reference signal to obtain the information of supply signal.

The mux/de-mux module 216 may be configured to adjust a termination impedance based on at least one control signal generated by the transceiver 214. More specifically, the mux/de-mux module 216 may control a resistance using a programmable resistor bank, such that a voltage level at the terminal 218, and also at the first terminal 204 of the front-end system 202, can vary in response to an amplitude of the frequency-modulated reference signal. In turn, the front-end side may obtain the information of the control signal generated by the transceiver 214.

According to embodiments of the present disclosure, while using a single transmission line between the front-end system and the transceiver system, the interferences between a plurality of signals can be reduced, and therefore output power from the front-end system does not need to be increased. Accordingly, it prevents degradation of RF characteristics due to heat generated in the device, and thus the front-end system can be placed close to antenna to eliminate cable losses. Furthermore, negative effects caused by frequency shifts of RF signals which may degrade accuracy of DPD can be prevented.

Figure 4A:
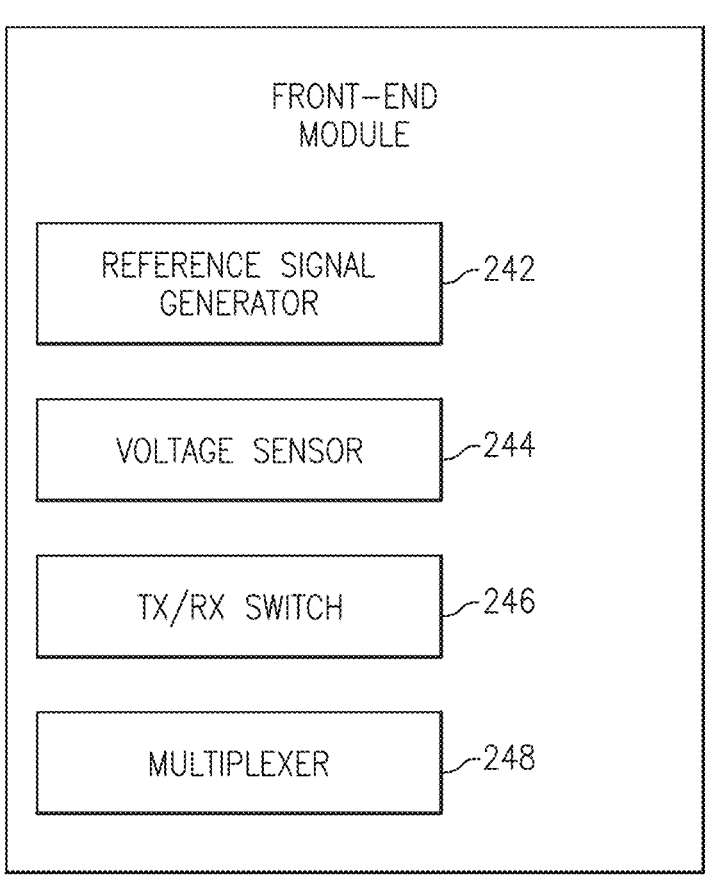
FIGS. 4A-4B are examples of schematic diagrams of front-end modules according to embodiments of the present disclosure.

FIG. 4A is an example of a schematic diagram of front-end module 208 according to an embodiment of the present disclosure. According to an embodiment, the front-end module 208 may be implemented to be the front-end in FIG. 1. In addition, the front-end module 208 may further have the functions described below. As shown in FIG. 4, the front-end module 208 may include a reference signal generator 242, a voltage sensor 244, a Tx/Rx switch 246, and multiplexer 248.

The reference signal generator 242 may be configured to generate a reference signal which is apart in frequency from the radio frequency signal. According to an embodiment, the reference signal may not overlap with the RF signal in frequency domain. For example, the reference signal may have a frequency in the range of 10 MHz, whereas the radio frequency may have a frequency in the range of 5 GHz or 6 GHz.

The reference signal generator 242 may modulate a frequency of the reference signal based on the supply signal. In other words, depending on the amount of supply signal, the frequency modulation of the reference signal can be tuned differently. In turn, the receiving side of the frequency modulated reference signal may determine the supply signal by decoding the frequency-modulated reference signal. Therefore, the frequency of the frequency-modulated reference signal may represent the supply signal.

According to an embodiment, the reference signal generator 242 may include a voltage controlled oscillator (VCO) for frequency modulation of the reference signal. The VCO may operate based on the supply signal, and it allows for the supply signal to be kept in the analog domain.

The voltage sensor 244 may be configured to sense a voltage level at the first terminal 204 when the frequency-modulated reference signal is being transmitted to the transceiver system 212. The voltage level sensed at the first terminal 204 can be used to determine the at least one control signal. The control signal may be generated by the transceiver 214 and can be used to control the front-end module 208. According to an embodiment, the voltage level may correspond to one of a plurality of values (for example, 0, 1, 2, or 3), each of which represents a respective control signal. Therefore, the amplitude of the frequency-modulated reference signal may represent the control signal.

The Tx/Rx switch 246 may be configured to state of front-end module 208 to determine either transmission mode or receiving mode.

The multiplexer 248 may be configured to combine or extract signals using different frequencies. For example, the multiplexer 248 may combine or extract DC, 10 MHz and 5 GHz signals. The multiplexer 248 may need an external inductor and capacitor for the DC signal component. According to an embodiment, the multiplexer 248 may be a triplexer.

Figure 4B:
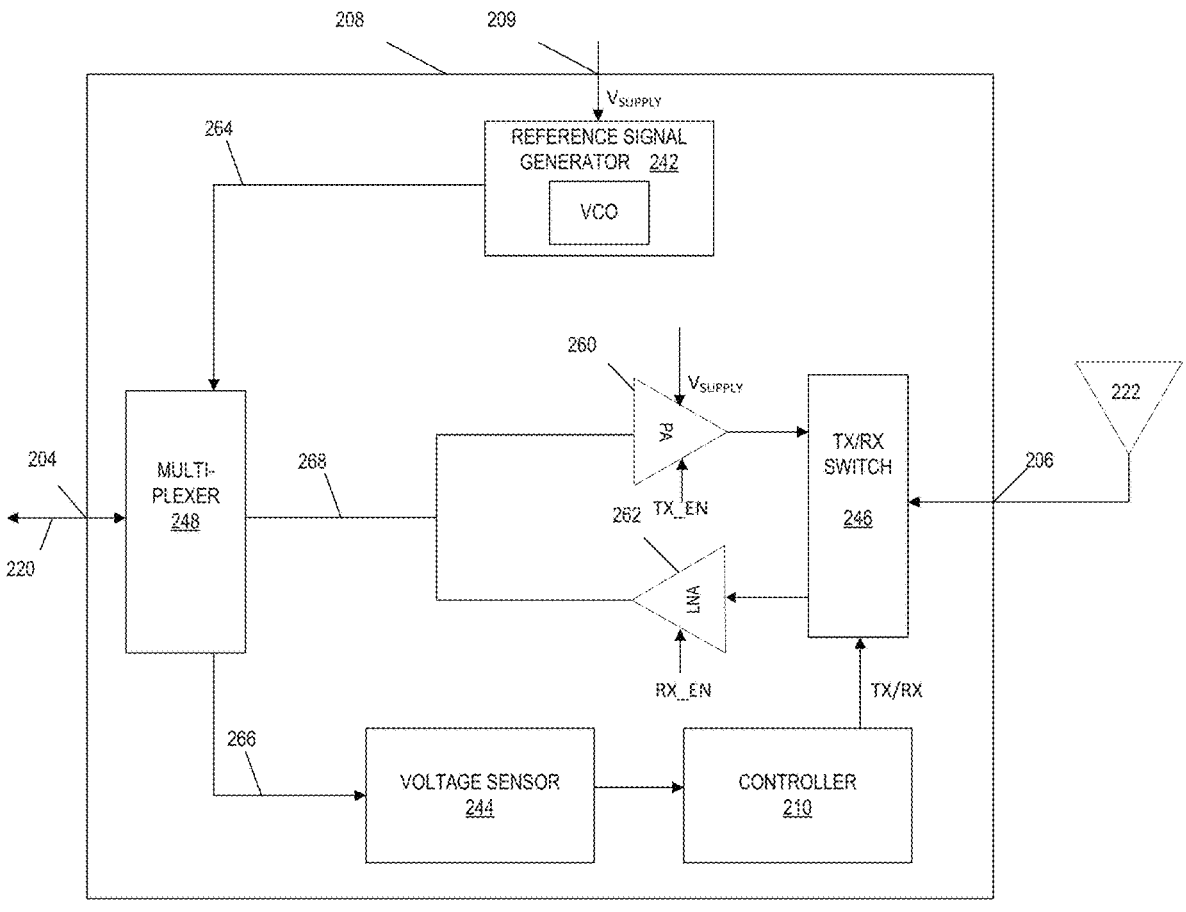

FIG. 4B shows an example of a front-end module 208, such as the front-end module 208 of FIG. 3 or 4A, in more detail, and similarly includes a reference signal generator 242, voltage sensor 244, TX/RX switch 246, and multiplexor 248. The front-end module 208 includes the controller 210, although the controller 210 can be external such as in the embodiment shown in FIG. 3.

The illustrated multiplexor 248 is a triplexer coupled on a first side to the first terminal 204 and the single transmission line between the front-end module 208 and the transceiver 214. The multiplexor 248 is coupled on a second side to receive the modulated reference signal 264 from the reference signal generator 242, to output the extracted control signal 266 to the voltage sensor 244, and to a combined RF connection 268 between the power amplifier 260 and the low noise amplifier 262. In other embodiments, the multiplexer 248 receives can be coupled separately to the power amplifier 260 and the low noise amplifier 262.

As shown, the reference signal generator 242 can be coupled to a third terminal 209 to receive a supply voltage. The supply voltage ($V_{SUPPLY}$) can be provided from a power management unit (not shown) for example and can be used to supply the power amplifier 260 and/or other components of the front-end module 208. The reference signal generator 242 can include a VCO that can be configured to generate a reference signal (e.g., a 10 MHz signal), which the reference signal generator 242 can frequency modulate based on the supply voltage to generate the reference signal 264.

The multi-plexor 248 can combine the modulated reference signal 264 received from the reference signal generator 242 together with the RF signal 268 onto the transmission line 220, thereby allowing for 1) communication of the content (e.g., VDET) carried by the modulated reference signal 264 to the transceiver 214, 2) communication of RF downlink content from the antenna 222 to the transceiver 214, and 3) communication of RF uplink of content from the transceiver 214 to the antenna 222. The mux/de-mux module 216 can in turn extract VDET from the modulated reference signal 264 received via the transmission line 220, as discussed previous with respect to FIG. 3, for example.

The multiplexer 248 can also extract the voltage level from the signal received on the transmission line 220 to output the extracted control signal 266 received from the mux/de-mux module 216 of the transceiver 214. The voltage sensor 244 can be configured to decode the extracted control signal 266 and output the decoded control signal (e.g., C0, C1, PA_EN) to the controller 210. The controller 210 can output various control signals based on the decoded control signal received from the voltage sensor 244. For instance, the controller 210 can output: 1) a TX_EN signal to the power amplifier 260 to enable the power amplifier 260 when the decoded control signal indicates a RF transmission or uplink mode; 2) an RX EN signal to the low noise amplifier 262 to enable the low noise amplifier 262 when the decoded control signal indicates an RF receive or downlink mode; and/or 3) a TX/RX control signal to the switch 206. For example, the TX/RX control signal can, in time division duplex operation, cause the switch 246 to selectively connect the output of the power amplifier 260 to the antenna 222 during uplink, and to connect the antenna 222 to the input of the low noise amplifier 262 during downlink.

Figure 4C:
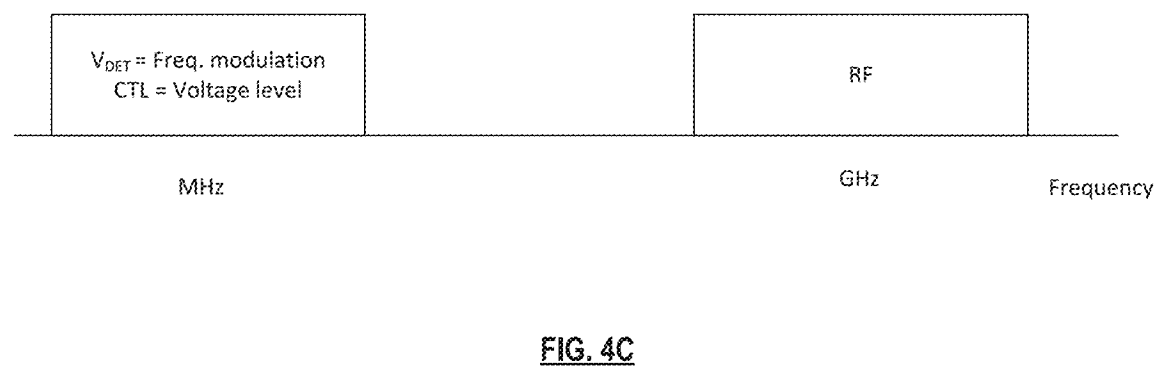

FIG. 4C shows the signal content on the single transmission line 220 according to certain embodiments. For example, VDET (e.g., the current supply voltage value) can be represented by the frequency modulation of the reference signal 264 (e.g., a modulated 10 MHz reference signal). Moreover, a control value (CTL) received from the transceiver 214 can be represented by the voltage level of the signal on the transmission line 220. The transmission line 220 can also carry RF signal content (e.g., 5 or 6 GHz Wi-Fi, or a cellular RF frequency band), which can include uplink content output by the transceiver 214 and/or downlink content received from the antenna 222.

Figure 5:
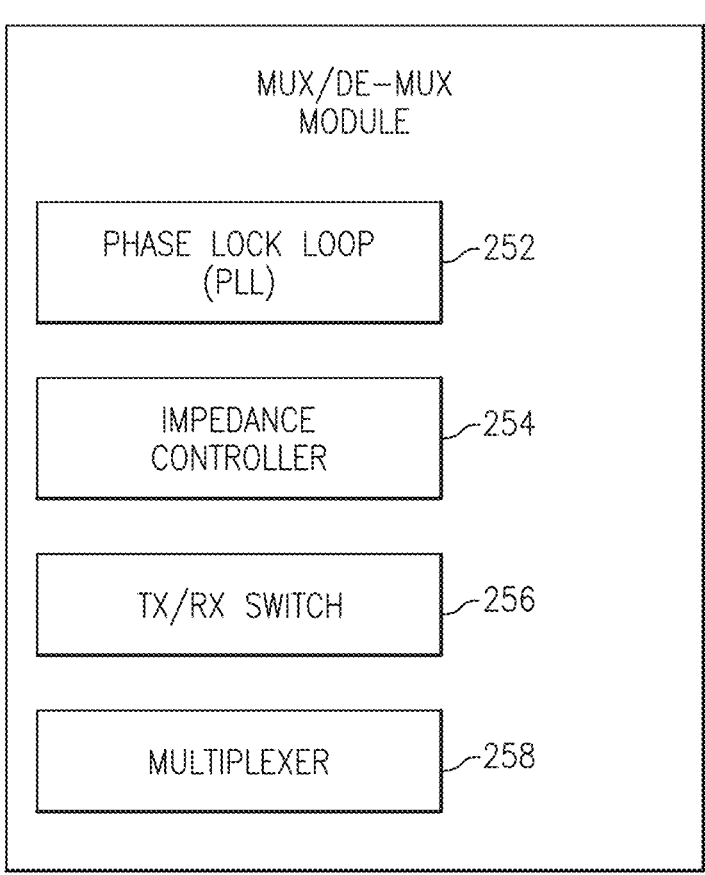
FIG. 5 is an example of a schematic diagram of a mux/de-mux module of the transceiver system according to an embodiment of the present disclosure.

FIG. 5 is an example of a schematic diagram of mux/de-mux module 216 of the transceiver system 212 according to an embodiment of the present disclosure. As shown in FIG. 5, the mux/de-mux module 216 may include a phase-locked loop (PLL) 252, an impedance controller 254, a Tx/Rx switch 256, and a multiplexer 258.

The PLL 252 may be configured to determine a supply signal representing an output power of the radio frequency signal at the front-end system based on a frequency of the frequency-modulated reference signal. The PLL 252 may be configured to decode the frequency-modulated reference signal to obtain the information of the supply signal. The PLL 252 may generate a voltage identical to that of the supply voltage so that the PLL 252 matches the frequency-modulated reference signal.

The impedance controller 254 may be configured to adjust a termination impedance based on at least one control signal generated by the transceiver 214. More specifically, the impedance controller 254 may control a resistance using a programmable resistor bank, such that a voltage level at the terminal 218, and also at first terminal 204 of the front-end system 202, can vary in response to an amplitude of the frequency-modulated reference signal. In turn, the front-end system 202 may obtain the information of the control signal generated by the transceiver 214.

The Tx/Rx switch 256 may be configured to state of transceiver system 212 to determine either transmission mode or receiving mode.

The multiplexer 258 may be configured to combine or extract signals using different frequencies. For example, the multiplexer 248 may combine or extract DC, 10 MHz and 5 GHz signals. The multiplexer 258 may need an external inductor and capacitor for the DC signal component. According to an embodiment, the multiplexer 258 may be a triplexer.

Figure 6:
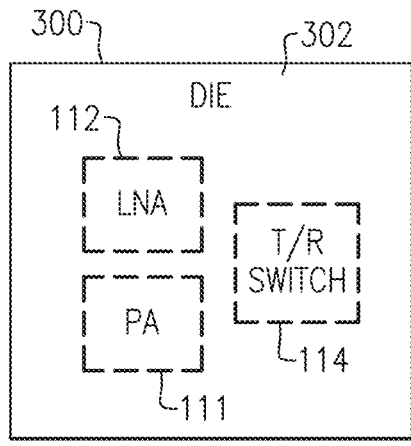
FIG. 6 shows that in some embodiments, a front-end integrated circuit (FEIC) having one or more features as described herein can be implemented in a single semiconductor die.

FIG. 6 shows that in some embodiments, an FEIC (e.g., a WLAN FEIC) having one or more features as described herein can be implemented in a single semiconductor die 300. Such a die can include a substrate 302 configured to allow SiGe BiCMOS processes for formation of a PA 111, an LNA 112, and a T/R switch 114. It will be understood that such PA, LNA, and/or T/R switches can include related circuits as described herein.

Figure 7A:
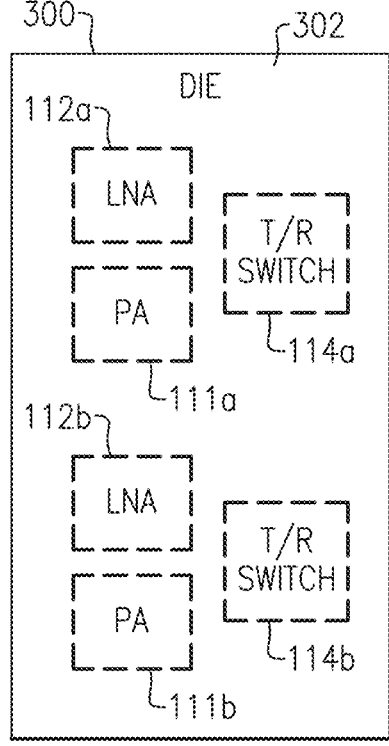
FIG. 7A shows that in some embodiments, a semiconductor die can include more than one group of power amplifier, low-noise amplifier and transmit/receive switch combinations implemented on its substrate.

FIG. 7A shows that in some embodiments, a semiconductor die 300 such as that of FIG. 6 can include more than one group of PA, LNA and T/R switch combinations implemented on a substrate 302. For example, the first group can include a first PA 111 *a*, a first LNA 112 *a*, and a first T/R switch 114 *a* implemented on the substrate 302 and configured to provide FEIC functionality for, for example, one or more WLAN bands. The second group can include a second PA 111 *b*, a second LNA 112 *b*, and a second T/R switch 114 *b* implemented on the same substrate 302 and configured to provide FEIC functionality for, for example, one or more other WLAN bands.

Figure 7B:
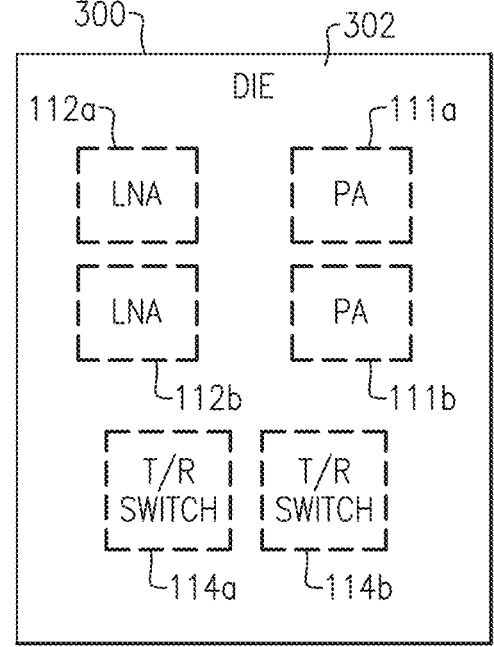
FIG. 7B shows that in some embodiments, functionally similar components can be implemented generally together on a substrate of a semiconductor die.

In the example of FIG. 7A, various components of each group are shown to be generally clustered together on the substrate 302. It will be understood that such an arrangement is an example, and not necessarily a requirement. It will also be understood that other arrangements of components can also be implemented. For example, FIG. 7B shows that in some embodiments, functionally similar components can be implemented generally together on a substrate 302 of a semiconductor die 300. In the example of FIG. 11B, first and second PAs 111 *a*, 111 *b* are shown to be implemented relatively close to each other on the substrate 302. Similarly, first and second LNAs 112 *a*, 112 *b* are shown to be implemented relatively close to each other on the substrate 302. Similarly, first and second T/R switches 114 *a*, 114*b* are shown to be implemented relatively close to each other on the substrate 302.

In some embodiments, some or all of functionalities associated with each of some or all of the PAs 111*a*, 111*b*, the LNAs 112*a*, 112*b*, and the T/R switches 114*a*, 114*b* can be combined and implemented on the substrate.

Figure 8:
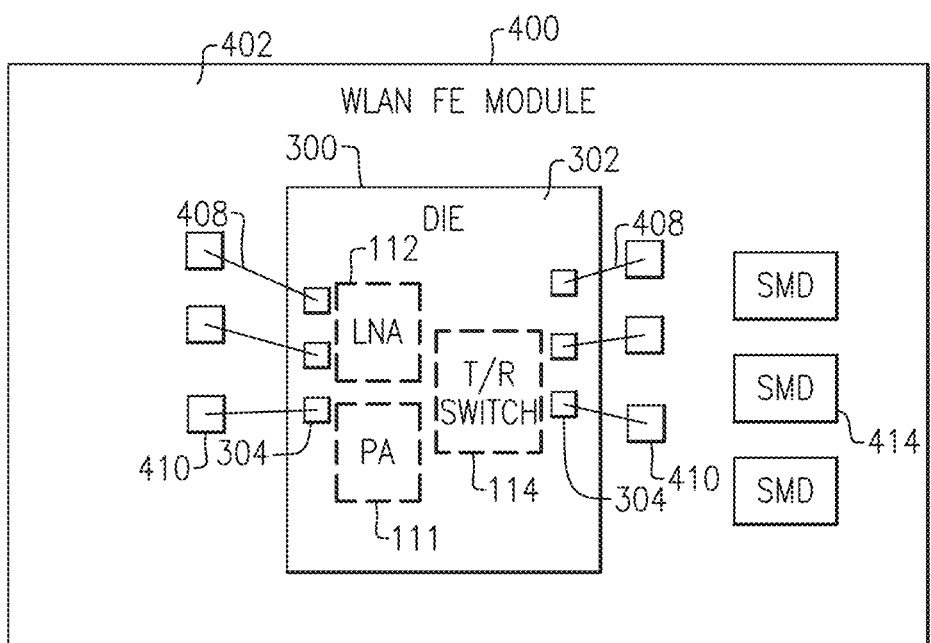
FIG. 8 depicts an example module having one or more features as described herein.

In some implementations, one or more features described herein can be included in a module. FIG. 8 depicts an example module 400 having a packaging substrate 402 that is configured to receive a plurality of components. In some embodiments, such components can include a die 300 having one or more features as described herein. For example, the die 300 can include a semiconductor die 302, and implemented thereon are a PA 111, an LNA 112, and a T/R switch 114. A plurality of connection pads 304 can facilitate electrical connections such as wirebonds 408 to connection pads 410 on the packaging substrate 402 to facilitate passing of various power and signals to and from the die 300.

In some embodiments, other components can be mounted on or formed on the packaging substrate 402. For example, one or more surface mount devices (SMDs) (414) can be implemented. In some embodiments, the packaging substrate 402 can include a laminate substrate.

In some embodiments, the module 400 can also include one or more packaging structures to, for example, provide protection and facilitate easier handling of the module 400. Such a packaging structure can include an overmold formed over the packaging substrate 402 and dimensioned to substantially encapsulate the various circuits and components thereon.

It will be understood that although the module 400 is described in the context of wirebond-based electrical connections, one or more features of the present disclosure can also be implemented in other packaging configurations, including flip-chip configurations.

In some embodiments, the module 400 of FIG. 8 can be, for example, an FE module such as a WLAN FE module. It will be understood that one or more features of the present disclosure can also be implemented in other types of RF modules.

Figure 9:
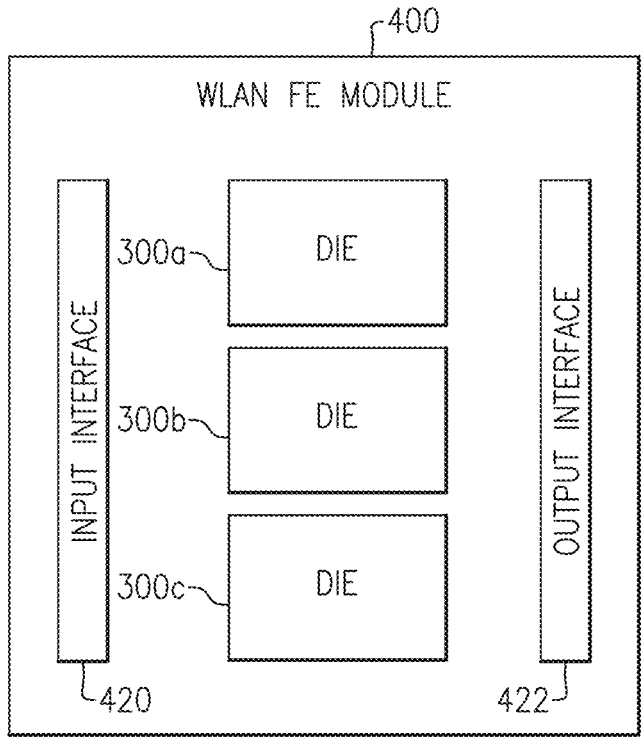
FIG. 9 shows an example module having a multiple-input multiple-output (MIMO) functionality.

FIG. 9 shows that in some embodiments, a WLAN FE module 400 can include a plurality of semiconductor die each having one or more features as described herein. For example, three die 300*a*, 300*b*, 300*c* are shown to be implemented in the module 400, and each of the three die can be similar to the example die described herein in reference to FIGS. 6-8. Such die can facilitate, for example, MIMO functionality for the WLAN FE module 400. Such MIMO functionality can be facilitated by an input interface 420 and an output interface 422.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 10:
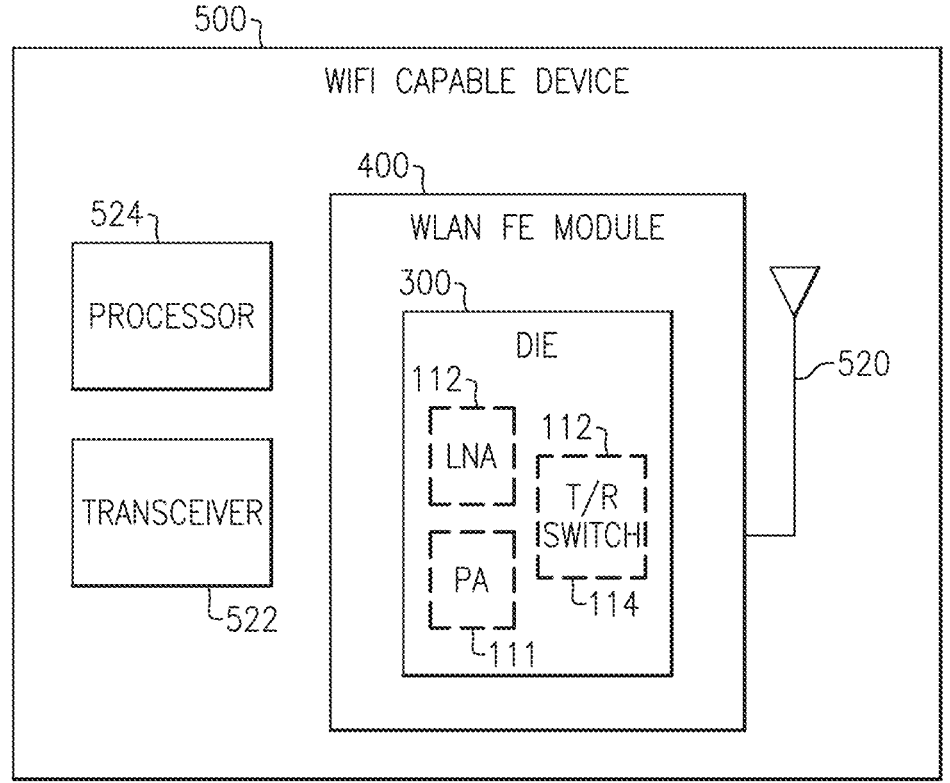
FIG. 10 shows an example wireless device having one or more features as described herein.

FIG. 10 shows that a semiconductor die 300 having one or more features as described herein can be included in a wireless device such as a WLAN capable device 500. As described herein, such a semiconductor die can include a PA 111, an LNA 112, and a T/R switch 114. Such a semiconductor die can be included in a WLAN FE module 400.

In the example of FIG. 10, the wireless device 500 can also include a transceiver 522 for generating an RF signal to be amplified by the PA 111 and transmitted through an antenna 520, and for processing a received RF signal received through the antenna 520 and amplified by the LNA 112. The wireless device 500 can also include a processor 524 configured to provide various control functionalities.

Figure 11:
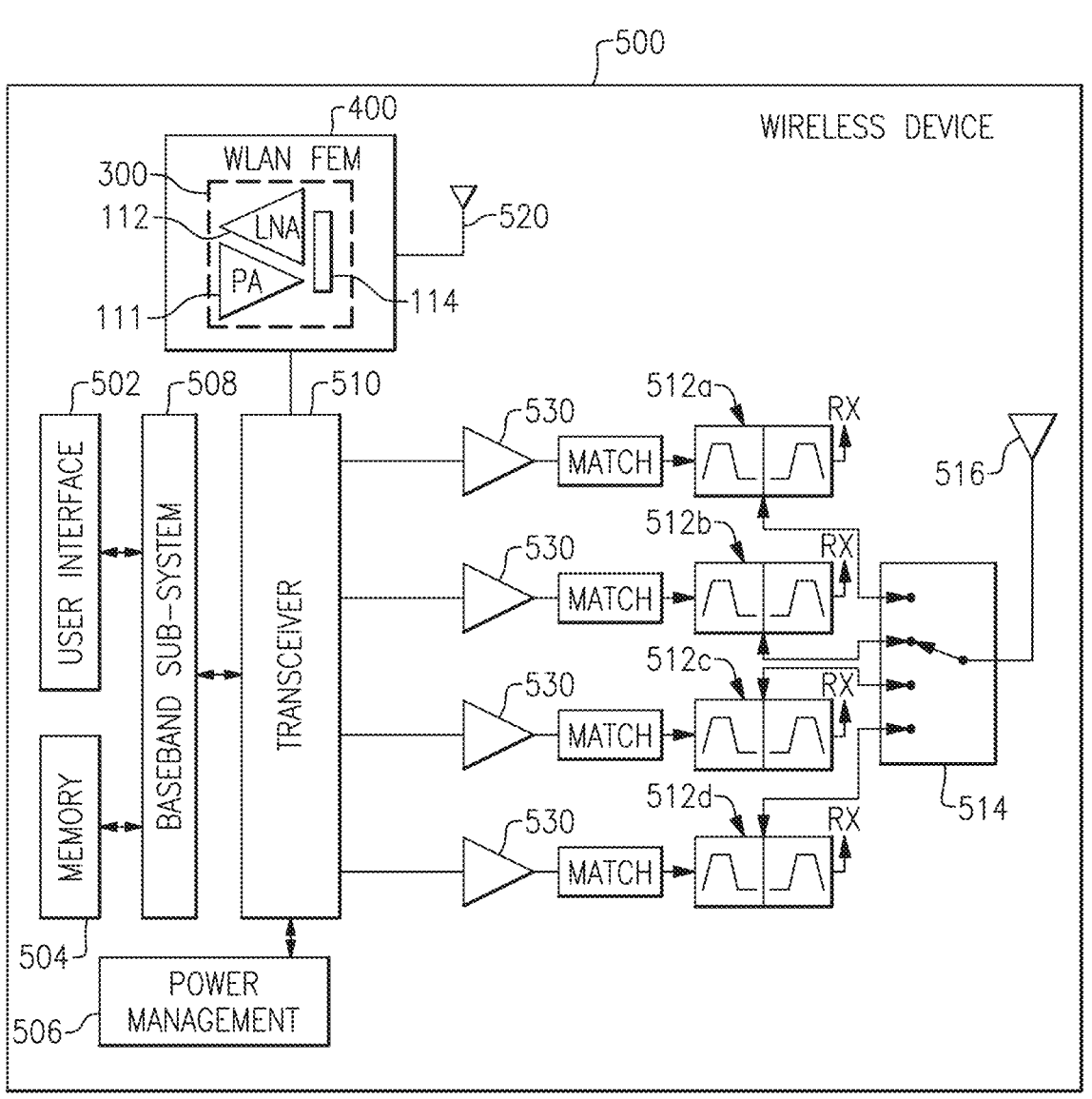
FIG. 11 shows another example wireless device having one or more features as described herein.

In some embodiments, an FE module having one or more features as described herein can be implemented in a wireless device having, for example, cellular functionalities. FIG. 11 schematically depicts an example wireless device 500 having one or more advantageous features described herein. A WLAN FE module 400 having a die 300 with a PA 111, an LNA 112, and a T/R switch 114 can be included in the wireless device 500. Such a WLAN FE module can facilitate transmission of an amplified RF signal through an antenna 520, and processing of a received RF signal from the antenna 520. Such an RF signal to be transmitted can be generated by a transceiver 510; and the same transceiver 510 can process the received RF signal amplified by the WLAN FE module 400.

In some embodiments, the transceiver 510 can be configured to also generate a cellular RF signal to be transmitted, and process a received cellular RF signal. One or more PAs 530 can receive their respective RF signals from the transceiver 510. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 530 are shown to be matched and routed to an antenna 516 via their respective duplexers 512a-512 d and a band-selection switch 514. The band-selection switch 514 can be configured to allow selection of, for example, an operating band or an operating mode. In some embodiments, each duplexer 512 can allow transmit and receive operations to be performed simultaneously using a common antenna (e.g., 516). In FIG. 11, received signals are shown to be routed to "Rx" paths that can include, for example, a low-noise amplifier (LNA).

In the various examples described herein, FEICs are described in the example context of 4.9-5.9 GHz WLAN frequency range. However, it will be understood that one or more features of the present disclosure can also be implemented with other WLAN frequencies and/or frequency ranges, including any channels using IEEE 802.11 protocols. Such channels can be parts of, for example, 2.4 GHz, 3.6 GHz, 4.9 GHz, 5 GHz, and 5.9 GHz bands.

Applications

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front-end system comprising:
a first terminal configured to receive a radio frequency signal from a transceiver;
a second terminal configured to be coupled to an antenna; and
a front-end module including a power amplifier configured to amplify the radio frequency signal when powered by a supply signal, the front-end module including a reference signal generator configured to generate a reference signal which is apart in frequency from the radio frequency signal, the reference signal generator configured to modulate a frequency of the reference signal based on the supply signal, the frequency-modulated reference signal being transmitted to the transceiver through the first terminal, the front-end module including a voltage sensor configured to sense a voltage level at the first terminal when the frequency-modulated reference signal is being transmitted to the transceiver to determine at least one control signal for controlling the front-end module.

2. The front-end system of claim 1 wherein the first terminal is configured to be coupled to a single transmission line connecting the front-end module with the transceiver.

3. The front-end system of claim 2 wherein the single transmission line is at least one of a coaxial cable, a microstrip line, a strip line, and a conductor transmission line.

4. The front-end system of claim 1 further comprising a controller configured to control a state of the front-end module based on the determined control signal.

5. The front-end system of claim 4 wherein the controller is configured to control at least one of an operation of the power amplifier, a receive amplifier or a switch included in the front-end module, and an envelope tracking signal.

6. The front-end system of claim 4 wherein the controller is configured to control a voltage controlled oscillator (VCO) included in the reference signal generator to perform the frequency modulation on the reference signal.

7. The front-end system of claim 1 wherein the supply signal has a form of an analog signal corresponding to the frequency-modulated reference signal.

8. The front-end system of claim 1 wherein the voltage level sensed at the first terminal corresponds to one of a plurality of values, each of which represents a respective control signal.

9. A transceiver system comprising:
a terminal coupled to a front-end system configured to transmit a radio frequency signal to the front-end system and to receive a frequency-modulated reference signal from the front-end system, the frequency-modulated reference signal being spaced apart in the frequency domain from the radio frequency signal;
a mux/de-mux module configured to determine a supply signal representing an output power of the radio frequency signal at the front-end system based on a frequency of the frequency-modulated reference signal, the mux/de-mux module configured to adjust a termination impedance based on at least one control signal for controlling the front-end system to control a voltage level at the terminal in response to an amplitude of the frequency-modulated reference signal; and
a transceiver circuit configured to generate the radio frequency and the at least one control signal, and to process the determined supply signal.

10. The transceiver system of claim 9 wherein the terminal is configured to be coupled to a single transmission line connecting the front-end system with the transceiver system.

11. The transceiver system of claim 10 wherein the single transmission line is at least one of a coaxial cable, a microstrip line, a strip line, and a conductor transmission line.

12. The transceiver system of claim 9 wherein the mux/de-mux module includes a phase-locked loop (PLL) to lock a frequency of the frequency-modulated reference signal to decode the frequency-modulated reference signal, and the mux/de-mux module is configured to transmit the decoded reference signal to the transceiver circuit.

13. The transceiver system of claim 9 wherein the mux/de-mux module is configured to adjust the termination impedance to control the voltage level to be one of a plurality of values each of which represents a respective control signal.

14. The transceiver system of claim 9 wherein the transceiver circuit is configured to generate the at least one control signal to control a state of the front-end system.

15. The transceiver system of claim 14 wherein the at least one control signal is configured to control at least one of an operation of a power amplifier, a receive amplifier or a switch included in the front-end system, and an envelope tracking signal.

16. The transceiver system of claim 9 wherein the supply signal has the form of an analog signal corresponding to the frequency of the frequency-modulated reference signal.

17. A mobile device comprising:
a front-end system configured to amplify a radio frequency signal when powered by a supply signal, the front-end system configured to generate a reference signal which is apart in frequency from the radio frequency signal, the front-end system configured to modulate a frequency of the reference signal based on the supply signal, the front-end system configured to sense a voltage level on a single transmission line when the frequency-modulated reference signal is applied to the single transmission line to determine at least one control signal for controlling the front-end system;

a transceiver configured to generate the radio frequency signal and the at least one control signal, the transceiver configured to determine the supply signal based on a frequency of the frequency-modulated reference signal, the transceiver configured to adjust a termination impedance based on the at least one control signal to control the voltage level on the single transmission line in response to an amplitude of the frequency-modulated reference signal, the single transmission line being coupled between the transceiver and the front-end system.

18. The mobile device of claim 17 wherein the single transmission line is at least one of a coaxial cable, a microstrip line, a strip line, and a conductor transmission line.

19. The mobile device of claim 17 wherein each of the front-end system and the transceiver includes a triplexer configured to combine or extract a DC signal, the frequency-modulated reference signal and the radio frequency signal onto the single transmission line.

20. The mobile device of claim 17 wherein the at least one control signal is configured to control a state of the front-end system.

* * * * *